United States Patent
Shi et al.

[11] Patent Number: 5,811,177
[45] Date of Patent: Sep. 22, 1998

[54] PASSIVATION OF ELECTROLUMINESCENT ORGANIC DEVICES

[75] Inventors: Song Q. Shi, Phoenix; Franky So, Tempe; Thomas B. Harvey, III, Scottsdale, all of Ariz.

[73] Assignee: Motorola, Inc., Schaumburg, Ill.

[21] Appl. No.: 565,123

[22] Filed: Nov. 30, 1995

[51] Int. Cl.⁶ ................................................. H05B 33/04
[52] U.S. Cl. ........................... 428/209; 428/201; 428/212; 428/457; 428/690; 428/917; 313/505; 313/506; 313/512; 427/66; 427/258; 427/404; 427/407.1; 427/419.1; 427/419.8; 257/88; 257/100
[58] Field of Search ..................... 313/500, 505, 313/506, 512; 257/88, 98, 99, 100; 428/690, 917, 201, 209, 212, 457; 427/66, 68, 123, 126.1, 258, 404, 407.1, 419.1, 419.8

[56] References Cited

U.S. PATENT DOCUMENTS

| | | | |
|---|---|---|---|
| 4,317,086 | 2/1982 | Scifres et al. | |
| 4,720,432 | 1/1988 | Van Slyke et al. | 428/457 |
| 5,059,861 | 10/1991 | Littman et al. | 313/503 |
| 5,427,858 | 6/1995 | Nakamura et al. | 428/421 |
| 5,587,589 | 12/1996 | So et al. | 257/40 |
| 5,652,067 | 7/1997 | Ito et al. | 428/690 |
| 5,686,360 | 11/1997 | Harvey, III et al. | 437/211 |
| 5,757,126 | 5/1998 | Harvey, III et al. | 313/506 |

OTHER PUBLICATIONS

*Grant & Hackh's Chemical Dictionary*, 5th ed., McGraw–Hill, Inc., 1987, p. 422.
*Concise Chemical and Technology Dictionary*, 4th ed., Chemical Publishing Co., Inc., 1986, p. 866.

*Primary Examiner*—Marie Yamnitzky
*Attorney, Agent, or Firm*—Eugene A. Parsons

[57] ABSTRACT

A method of passivating electroluminescent organic devices positioned on a supporting substrate including the steps of overcoating or capping the individual pixels, which form an array of electroluminescent organic devices, with a layer of stable metal, overcoating the layer of stable metal with a buffer system including a buffer layer of organic material and a thermal coefficient matching layer on the buffer layer, depositing a low permeability inorganic layer over the thermal coefficient matching layer, and sealing the electroluminescent organic device with an epoxy encapsulant or polymer laminated aluminum foil.

28 Claims, 2 Drawing Sheets

PASSIVATION OF ELECTROLUMINESCENT ORGANIC DEVICES

FIELD OF THE INVENTION

The present invention pertains to organic devices and more specifically to passivated electroluminescent organic devices and methods of passivation.

BACKGROUND OF THE INVENTION

Electroluminescent organic devices, and especially organic light emitting devices (LEDs) and the like, generally utilize a layer of low work function metal in the cathode to ensure efficient electron injecting electrodes and low operating voltages. However, the low work function metals are reactive and susceptible to oxygen and moisture, and oxidation of the metal limits the lifetime of the devices. A hermetic seal is normally required to achieve long term stability and longevity. Several types of hermetic seals are utilized, the most common of which are inorganic materials, such as metals and the like.

A further problem that occurs in the fabrication and passivation of electroluminescent organic devices is a result of the fact that the organic layers of the electroluminescent organic devices can not withstand very high temperatures (i.e. generally greater than approximately 300° C.). In many instances, even approaching the critical temperatures of the organic layers, especially if the elevated temperatures are maintained for relatively long periods of time, can degrade the organic material and reduce the reliability and/or the longevity of the resulting devices.

Several types of hermetic seals are utilized, the most common of which are metal cans. However, metal cans are very expensive to fabricate and require extensive labor to assemble. Further, metal cans are large and heavy so that they severely limit the applications of electroluminescent organic devices.

A more recent means of hermetically sealing electroluminescent organic devices is to overcoat them with an inorganic material, such as a dielectric or metal, to achieve a hermetic seal. However, the electroluminescent organic devices are very susceptible to the high temperatures normally required during deposition of dielectrics and metals. Thus, the ceramic or metal material generally must be deposited by PECVD methods in order to meet the low temperature criteria. The major problem with this method of sealing is that during the PECVD deposition there is a strong possibility of radiation damage to the electroluminescent organic device.

At the present time there exist a need to devise a relatively inexpensive and convenient method of hermetically sealing electroluminescent organic devices.

It is a purpose of the present invention to provide a new and improved passivated electroluminescent organic device and method of passivation.

It is another purpose of the present invention to provide a new and improved method of passivating electroluminescent organic devices which is relatively convenient and inexpensive to perform.

SUMMARY OF THE INVENTION

The above problems and others are at least partially solved and the above purposes and others are realized in a method of passivating electroluminescent organic devices positioned on a supporting substrate including the steps of overcoating or capping the individual pixels which comprise the array with a stable metal, overcoating the capped pixels with a buffer layer of organic material, depositing a thermal coefficient matching layer on the buffer layer, depositing a low permeability inorganic layer over the thermal coefficient matching layer and depositing a sealing layer over the inorganic layer, thereby encompassing the entire LED display area.

In a preferred embodiment the overcoating or capping of the pixels with a stable metal includes capping with a layer of indium (In), the buffer layer includes one of an organic polymer layer or an organometallic complex layer, the thermal coefficient matching layer is an active metal, which serves as a gettering material, the inorganic layer includes one of a stable metal such as aluminum (Al) or indium (In), and sealing of the LED is with one of an epoxy encapsulant or a polymer laminated aluminum foil.

BRIEF DESCRIPTION OF THE DRAWINGS

Referring to the drawings.

DESCRIPTION OF THE PREFERRED EMBODIMENTS

Figure 1:
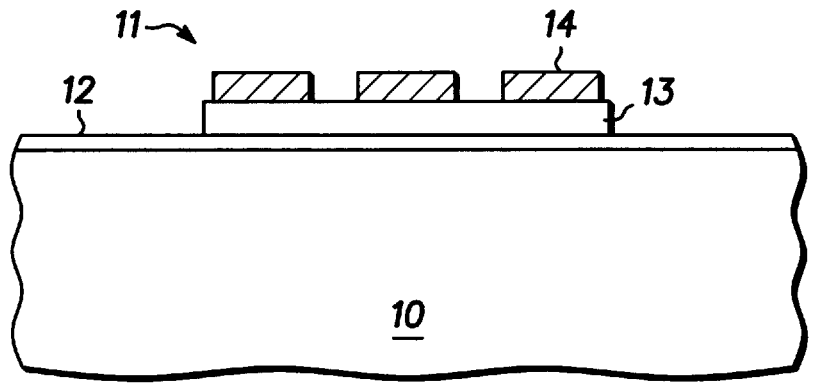
FIGS. 1–3 are simplified cross-sectional views of an organic LED array illustrating several steps in a method of passivation in accordance with the present invention.
Figure 2:
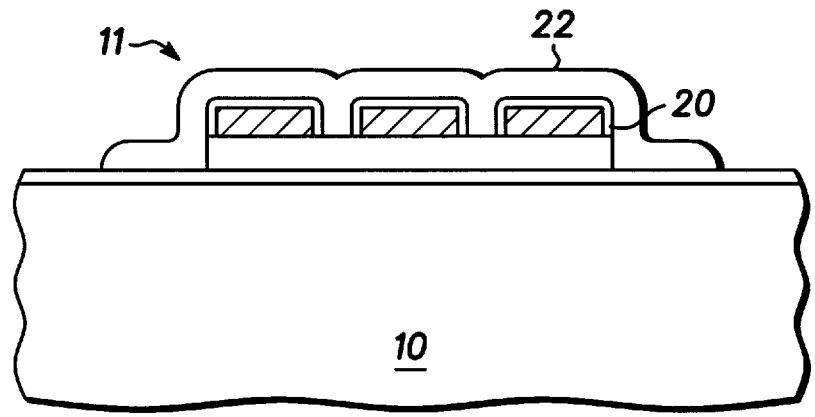
Figure 3:
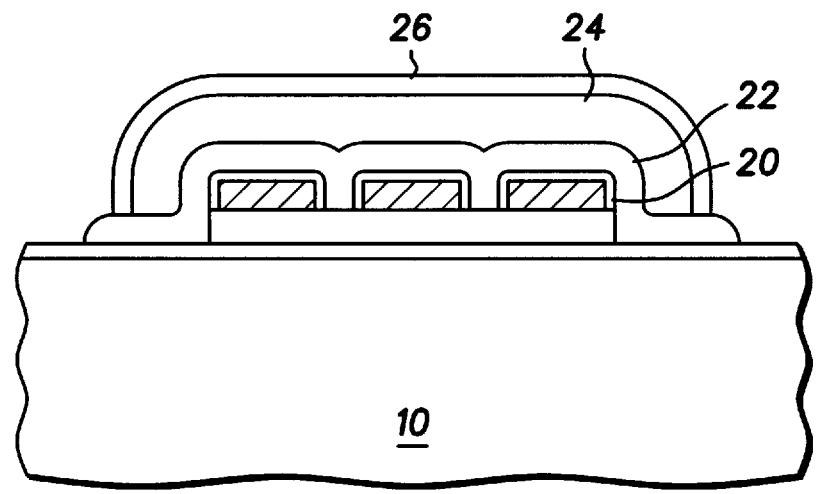

Referring to the drawings, wherein like characters indicate like parts throughout the figures, FIGS. 1–3 are simplified cross-sectional views of an organic LED array illustrating several steps in a method of passivation in accordance with the present invention.

Referring specifically to FIG. 1, a substrate 10 is illustrated which is, in this specific embodiment, some optically clear material, such as glass, quartz, a transparent semiconductor material or the like, etc. An array 11 of pixels of organic light emitting devices (LEDs) is positioned on substrate 10, generally by fabricating array 11 directly on substrate 10 in any of the various methods of fabricating electroluminescent organic LEDs. As a specific example, array 11 includes a transparent layer 12 of conductive material, such as indium-tin-oxide (ITO) or the like, with an active organic media 13, such as an organic electroluminescent media, positioned thereon and a cathode 14 formed of a metal layer including a thin layer of a low work function metal, more specifically less than 4 eV. As previously stated, array 11 of organic LEDs, and especially the layer of low work function metal, is susceptible to oxygen and moisture in the surrounding atmosphere and must, therefore, be passivated to provide reliability and a reasonable longevity.

First and second steps in the passivation of array 11 in accordance with the present invention are illustrated in FIG. 2. As a first step, the individual pixels which make up array 11 are capped or overcoated with a layer of stable metal 20 such as indium (In) or the like. This capping or overcoating serves as the initial protective coating for the individual pixels which make up array 11.

Next, array 11, capped with the layer of stable metal 20, is overcoated with a buffer system designed to generally match at least some of the characteristics of array 11 to an encapsulating system. The buffer system can include one or more layers of material specifically selected to match previous and/or subsequently deposited layers. In this specific example the buffer system includes a buffer layer 22 of organic material which generally serves to further protect array 11 from following process steps and materials. In addition, buffer layer 22 serves to act as a diffusion barrier to oxygen and moisture. As an example, buffer layer 22 may be either an organic polymer or an organometallic complex. Typical organic polymers which may be conveniently utilized are parylene, and the like. These polymers are convenient because they can be formed during thermal evaporation of monomers. No solvents are needed, so that the passivation process has minimum, or no, contamination, which further increases reliability and longevity of array 11.

These polymers (i.e. parylene and the like) have low coefficients of thermal expansion (CTE), close to the CTE of array 11 so that there is little or no stress created during thermal cycling. Also, both of these polymers have low dielectric constants and low permeability to oxygen and moisture. Generally, the thickness of buffer layer 22 depends upon the type of material utilized and the thicknesses of the remaining layers. However, assuming that buffer layer 22 is formed of parylene, a layer having a thickness in the range of approximately 0.5 to 2.0 mils should be thick enough to perform the desired functions.

In an example incorporating organometallic complexes, rather than organic polymers, a layer of tris (8-quinolinolato) aluminum (Alq) or the like is deposited over array 11. Since many electroluminescent organic devices utilize Alq in the active layers (as an emitter and/or electron transport material), this material may be uniquely matched to array 11 and it may be convenient to add buffer layer 22 to array 11 without requiring additional materials and equipment. As will be understood by those skilled in the art, other materials utilized in the active layers of specific arrays of electroluminescent organic devices may be utilized in buffer layer 22. Also, buffer layer 22 may include one or more sub-layers of different organic materials if this is required in specific applications.

Third and fourth steps in the passivation of array 11 in accordance with the present invention are illustrated in FIG. 3. Buffer layer 22 is in turn covered or coated with a thermal coefficient matching layer 24, which is a second layer in the buffer system. In a further step in the passivation process, thermal coefficient matching layer 24 is coated or covered with a low permeability inorganic layer 26, generally as illustrated in FIG. 3. Thermal coefficient matching layer 24 is generally included in the buffer system. Thermal coefficient matching layer 24 has a lower CTE than inorganic layer 26 so as to partially match the CTE of buffer layer 22, so as to reduce thermal stresses therebetween due to thermal cycling.

Some typical examples of thermal coefficient matching layer 24 and inorganic layer 26 are listed below. An active metal, such as lithium (Li) or magnesium (Mg) is utilized as thermal coefficient matching layer 24, acting as a gettering material to absorb trapped gasses within the inorganic layer. In a somewhat different embodiment, silicon dioxide ($SiO_2$) or a low work function metal, such as lithium (Li) or magnesium (Mg), is utilized as thermal coefficient matching layer 24. A stable metal, such as one of aluminum (Al) or indium (In) is utilized as inorganic layer 26.

Again, it should be understood that thermal coefficient matching layer 24 could include sub-layers of one or more of the above, or similar, materials so as to provide a combination of the functions. Also, the thicknesses of thermal coefficient matching layer 24 and inorganic layer 26 generally, in combination, is in the range of approximately 0.05 to 10 micron, but should be thick enough to perform the desired functions. If multiple sub-layers are utilized, the overall thickness is generally similar to that of a single layer.

Thus, the initial overcoating layer 20 of the stable metal, such as indium (In) or the like, serves to protect array 11 from the following steps of the process. Buffer layer 22 serves to act as a diffusion layer and protects array 11 from oxygen and moisture and also helps to match the CTE of following layers. Thermal coefficient matching layer 24 serves to match the CTE of buffer layer 22 to inorganic layer 26 and includes gettering material for atmospheric oxygen and moisture. It should also be noted that each successive layer generally has a lower permeability than the previous layer so that the overall structure has a better resistance to permeation than prior structures that are simply encapsulated with a layer of inorganic material.

Figure 4:
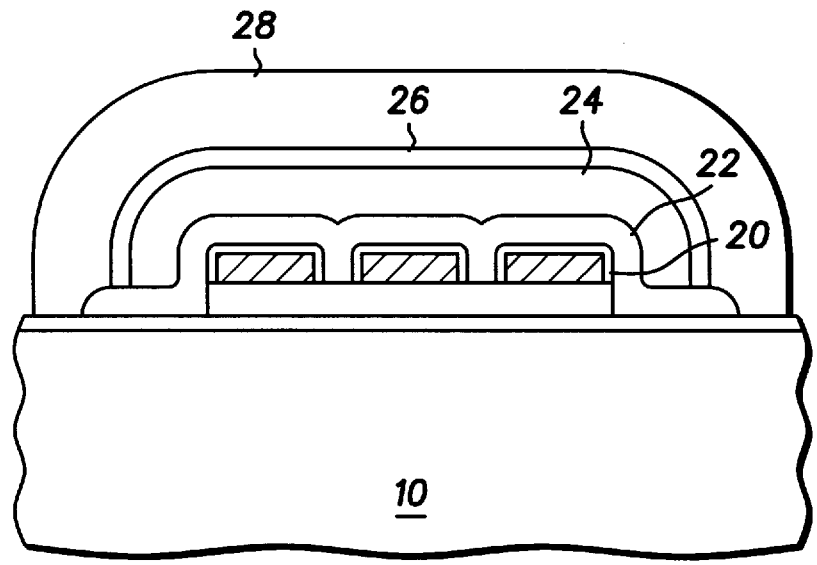
FIG. 4 is an embodiment of an organic LED device in accordance with the present invention illustrating an epoxy encapsulant sealing the device.
Figure 5:
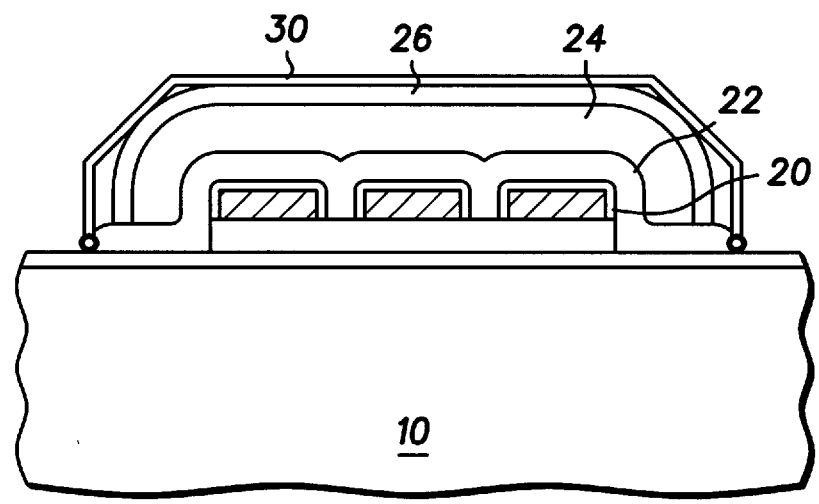
FIG. 5 is an embodiment of an organic LED device in accordance with the present invention illustrating a polymer laminated aluminum foil layer sealing the device.

Array 11 is finally sealed by a layer of epoxy encapsulant or polymer laminated aluminum foil. Shown in FIG. 4 is an embodiment of the preferred passivated electroluminescent organic device, wherein the organic LED array 11 is sealed by an epoxy encapsulant 28. Organic LED array 11 in an alternative embodiment is sealed with a polymer laminated aluminum foil 30 as illustrated in FIG. 5. Because of buffer layer 22 and the thermal coefficient matching throughout, array 11 is not damaged, degraded, or otherwise compromised by the encapsulation operation or by thermal cycling of the finished product. Further, the present invention includes a more manufacturable process than prior art methods and devices.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of passivating organic devices comprising the steps of:

providing an organic device on a supporting substrate defining a plurality of pixels, each of the plurality of pixels including a cathode comprised of a low work function metal;

individually capping each of the plurality of pixels with a layer of indium;

overcoating the plurality of pixels of the organic device, each individually capped by the layer of indium, with a buffer system for protection of the plurality of pixels from further process steps and materials, including a layer of organic material positioned on each layer of indium;

depositing an inorganic layer over the buffer system; and sealing the organic device with a sealing layer of one of an epoxy encapsulant or a polymer laminated aluminum foil.

2. A method of passivating organic devices as claimed in claim 1 including a step of depositing a thermal coefficient matching layer on the layer of organic material as a portion of the buffer system.

3. A method of passivating organic devices as claimed in claim 2 wherein the step of depositing the thermal coefficient matching layer on the layer of organic material includes depositing a layer of low work function metal.

4. A method of passivating organic devices as claimed in claim 2 wherein the step of depositing the thermal coefficient matching layer on the layer of organic material includes depositing a layer of gettering material.

5. A method of passivating organic devices as claimed in claim 4 wherein the step of depositing the gettering material includes depositing a layer of low work function metal.

6. A method of passivating organic devices as claimed in claim 5 wherein the step of depositing the layer of low work function metal includes depositing one of lithium or magnesium.

7. A method of passivating organic devices as claimed in claim 5 wherein the step of depositing the inorganic layer over the thermal coefficient matching layer includes depositing at least one of a layer of aluminum or indium over the layer of low work function metal.

8. A method of passivating organic devices as claimed in claim 1 wherein the step of overcoating the organic device with the layer of organic material includes overcoating the organic device with an organic polymer.

9. A method of passivating organic devices as claimed in claim 8 wherein the step of overcoating the organic device with the organic polymer includes overcoating with parylene.

10. A method of passivating organic devices as claimed in claim 1 wherein the step of overcoating the organic device with the layer of organic material includes overcoating the organic device with an organometallic complex.

11. A method of passivating organic devices as claimed in claim 10 wherein the step of overcoating the organic device with the organometallic complex includes overcoating with Alq.

12. A method of passivating organic devices as claimed in claim 1 wherein the step of sealing the organic device includes depositing a layer of epoxy encapsulant over the inorganic layer.

13. A method of passivating organic devices as claimed in claim 1 wherein the step of sealing the organic device includes applying a layer of polymer coated aluminum foil over the inorganic layer.

14. A method of passivating organic devices comprising the steps of:
providing an array of organic LEDs on a supporting substrate defining a plurality of pixels, each of the plurality of pixels including a cathode comprised of a low work function metal;
individually overcoating each of the plurality of pixels with a layer of indium;
overcoating the layer of indium of each of the plurality of pixels with a layer of one of an organic polymer or an organometallic complex;
depositing a thermal coefficient matching layer of a low work function metal on the layer of one of an organic polymer or an organometallic complex;
depositing an inorganic layer of at least one of a layer of aluminum or indium over the thermal coefficient matching layer; and
sealing the organic device with at least one of a layer of epoxy encapsulant or polymer laminated aluminum foil.

15. A passivated organic device comprising:
an organic device on a supporting substrate defining a plurality of pixels, each of the plurality of pixels including a cathode comprised of a low work function metal;
an overcoating layer of indium, individually capping the plurality of pixels;
a buffer system including an overcoating layer of organic material coating the layer of indium, individually capping the pixels;
an inorganic layer position on the buffer system; and
a sealing layer positioned on the inorganic layer.

16. A passivated organic device as claimed in claim 15 wherein the buffer system further includes a thermal coefficient matching layer positioned on the layer of organic material.

17. A passivated organic device as claimed in claim 16 wherein the thermal coefficient matching layer positioned on the layer of organic material includes a layer of low work function metal.

18. A passivated organic device as claimed in claim 16 wherein the inorganic layer includes at least one of a layer of aluminum or indium positioned over the thermal coefficient matching layer.

19. A passivated organic device as claimed in claim 16 wherein the thermal coefficient matching layer positioned on the layer of organic material includes a layer of gettering material.

20. A passivated organic device as claimed in claim 20 wherein the gettering material includes a layer of low work function metal.

21. A passivated organic device as claimed in claim 20 wherein the layer of low work function metal includes one of lithium or magnesium.

22. A passivated organic device as claimed in claim 15 wherein the layer of organic material includes an organic polymer.

23. A passivated organic device as claimed in claim 22 wherein the organic polymer includes parylene.

24. A passivated organic device as claimed in claim 15 wherein the layer of organic material includes an organometallic complex.

25. A passivated organic device as claimed in claim 24 wherein the organometallic complex includes Alq.

26. A passivated organic device as claimed in claim 15 wherein the sealing layer includes a layer of epoxy encapsulant.

27. A passivated organic device as claimed in claim 15 wherein the sealing layer includes a layer of polymer laminated aluminum foil.

28. A passivated organic device comprising:
an array of organic LEDs positioned on a supporting substrate, defining a plurality of pixels, each of the plurality of pixels including a cathode comprised of a low work function metal;
a layer of indium individually overcoating each of the plurality of pixels of the organic device;
a layer of one of an organic polymer or an organometallic complex overcoating the layer of indium;
a thermal coefficient matching layer of low work function metal positioned on the layer of one of an organic polymer or an organometallic complex;
an inorganic layer positioned on the thermal coefficient matching layer; and
a sealing layer of at least one of an epoxy encapsulant or a polymer laminated aluminum foil positioned over the inorganic layer.

* * * * *

UNITED STATES PATENT AND TRADEMARK OFFICE
CERTIFICATE OF CORRECTION

PATENT NO. : 5,811,177
DATED : September 22, 1998
INVENTOR(S) : Song Q. Shi et al.

It is certified that error appears in the above-indentified patent and that said Letters Patent is hereby corrected as shown below:

In Claim 20, column 6, line 24, delete "20" and insert --19--.

Signed and Sealed this

Twelfth Day of January, 1999

Attest:

Attesting Officer

*Acting Commissioner of Patents and Trademarks*